United States Patent
Teh et al.

(10) Patent No.: US 9,299,660 B2
(45) Date of Patent: Mar. 29, 2016

(54) CONTROLLED SOLDER-ON-DIE INTEGRATIONS ON PACKAGES AND METHODS OF ASSEMBLING SAME

(75) Inventors: Weng Hong Teh, Phoenix, AZ (US); Shan Zhong, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/977,473

(22) PCT Filed: Nov. 14, 2011

(86) PCT No.: PCT/US2011/060522
§ 371 (c)(1),
(2), (4) Date: Jun. 28, 2013

(87) PCT Pub. No.: WO2013/074061
PCT Pub. Date: May 23, 2013

(65) Prior Publication Data
US 2013/0277837 A1 Oct. 24, 2013

(51) Int. Cl.
*H01L 23/48* (2006.01)
*H01L 23/52* (2006.01)
(Continued)

(52) U.S. Cl.
CPC ............ *H01L 23/5384* (2013.01); *H01L 21/82* (2013.01); *H01L 23/49811* (2013.01); *H01L 23/5389* (2013.01); *H01L 24/03* (2013.01); *H01L 24/11* (2013.01); *H01L 24/13* (2013.01); *H01L 24/14* (2013.01); *H01L 24/92* (2013.01); *H01L 25/0657* (2013.01); *H01L 25/50* (2013.01); *H01L 23/49816* (2013.01); *H01L 24/16* (2013.01); *H01L 25/105* (2013.01); *H01L 25/18* (2013.01); *H01L 2224/0331* (2013.01); *H01L 2224/0346* (2013.01); *H01L 2224/0348* (2013.01); *H01L 2224/0401* (2013.01); *H01L 2224/0557* (2013.01); *H01L 2224/05541* (2013.01); *H01L 2224/05571* (2013.01); *H01L 2224/1147* (2013.01); *H01L 2224/11849* (2013.01); *H01L 2224/131* (2013.01);
(Continued)

(58) Field of Classification Search
None
See application file for complete search history.

(56) References Cited

U.S. PATENT DOCUMENTS 6,235,624 B1 * 5/2001 Sasaki et al. .................. 438/618
6,599,778 B2 7/2003 Pogge et al.
(Continued)

FOREIGN PATENT DOCUMENTS

WO 2013074061 A1 5/2013

OTHER PUBLICATIONS

International Preliminary Report on Patentability received for International Application No. PCT/US2011/060522, mailed on May 30, 2014, 8 pages.
(Continued)

*Primary Examiner* — Sonya D McCall Shepard
(74) *Attorney, Agent, or Firm* — John N. Greaves

(57) ABSTRACT

A process of bumping a die backside includes opening a recess in a die backside film (DBF) to expose a through-silicon via (TSV) contact in a die, followed by filling the recess with a conductive material that contacts the TSV contact. Added solder is coupled to the conductive material at a level of the DBF. A subsequent die is coupled to the first die at the added solder to form an electrical coupling consisting of the TSV contact, the conductive material, and the added solder, an electrical bump coupled to the subsequent die. Apparatus and computer systems are assembled using the process.

23 Claims, 12 Drawing Sheets

(51) Int. Cl.
  *H01L 29/40* (2006.01)
  *H01L 23/538* (2006.01)
  *H01L 21/82* (2006.01)
  *H01L 23/498* (2006.01)
  *H01L 23/00* (2006.01)
  *H01L 25/065* (2006.01)
  *H01L 25/00* (2006.01)
  *H01L 25/10* (2006.01)
  *H01L 25/18* (2006.01)

(52) U.S. Cl.
  CPC ......... *H01L2224/13023* (2013.01); *H01L 2224/13082* (2013.01); *H01L 2224/16145* (2013.01); *H01L 2224/16225* (2013.01); *H01L 2224/16227* (2013.01); *H01L 2224/17181* (2013.01); *H01L 2224/81193* (2013.01); *H01L 2224/9202* (2013.01); *H01L 2225/06513* (2013.01); *H01L 2225/06548* (2013.01); *H01L 2924/00014* (2013.01)

(56) References Cited

U.S. PATENT DOCUMENTS

| | | | |
|---|---|---|---|
| 7,727,896 B1* | 6/2010 | Rahman | 438/700 |
| 2007/0001266 A1* | 1/2007 | Arana et al. | 257/621 |
| 2009/0008792 A1 | 1/2009 | Ko et al. | |
| 2010/0187671 A1 | 7/2010 | Lin et al. | |
| 2011/0241186 A1 | 10/2011 | Nalla et al. | |
| 2011/0254124 A1 | 10/2011 | Nalla et al. | |
| 2011/0303936 A1* | 12/2011 | Wu | 257/98 |
| 2013/0277837 A1 | 10/2013 | Teh et al. | |

OTHER PUBLICATIONS

International Search Report and Written Opinion received for International Application No. PCT/US2011/060522, mailed on Jul. 30, 2012,11 pages.

Office Action Received for Germany Patent Application No. DE112011105848.9 mailed on Oct. 22, 2014, 6 pages of Office Action. (English Abstract only).

Office Action Received for Korean patent Application No. 2014-7012676 mailed on Sep. 26, 2015, 5 pages of Office Action and 5 pages of English Translation.

* cited by examiner

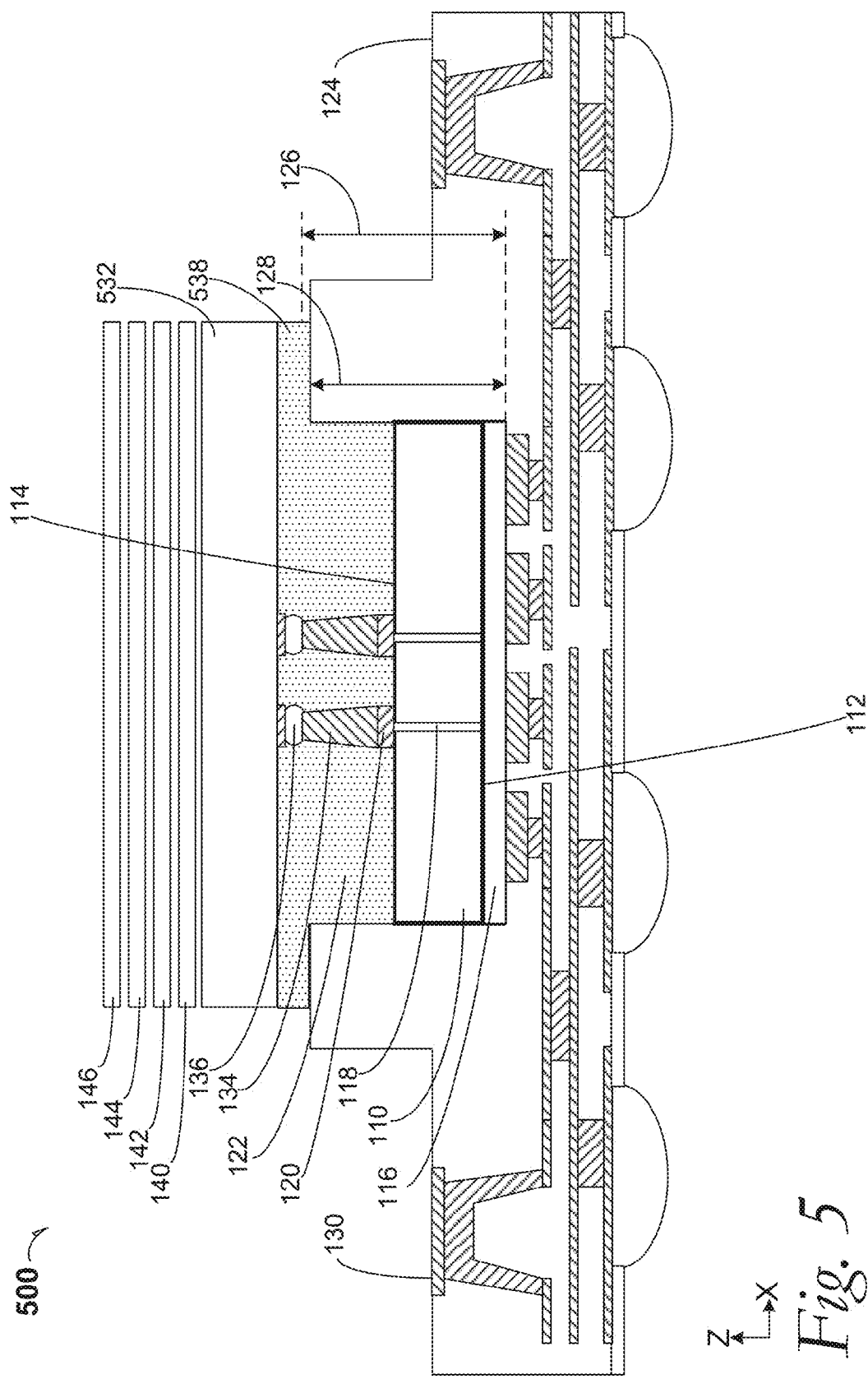

CONTROLLED SOLDER-ON-DIE INTEGRATIONS ON PACKAGES AND METHODS OF ASSEMBLING SAME

TECHNICAL FIELD

Disclosed embodiments relate to die backside films that are patterned to expose through-silicon via contacts and methods of coupling a stacked die to the via contacts.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which:

FIG. 5 is a cross-section elevation of an apparatus that includes an embedded die with a controlled-deposit solder coupling according to an example embodiment;

DETAILED DESCRIPTION

Processes are disclosed for die backside films (DBFs) that are patterned in order to couple through-silicon vias (TSVs) to stacked devices.

Reference will now be made to the drawings wherein like structures may be provided with like suffix reference designations. In order to show the structures of various embodiments more clearly, the drawings included herein are diagrammatic representations of integrated circuit chips assembled with stacked-die TSV structures. Thus, the actual appearance of the fabricated chip substrates, alone or in chip packages, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings.

Figure 1:
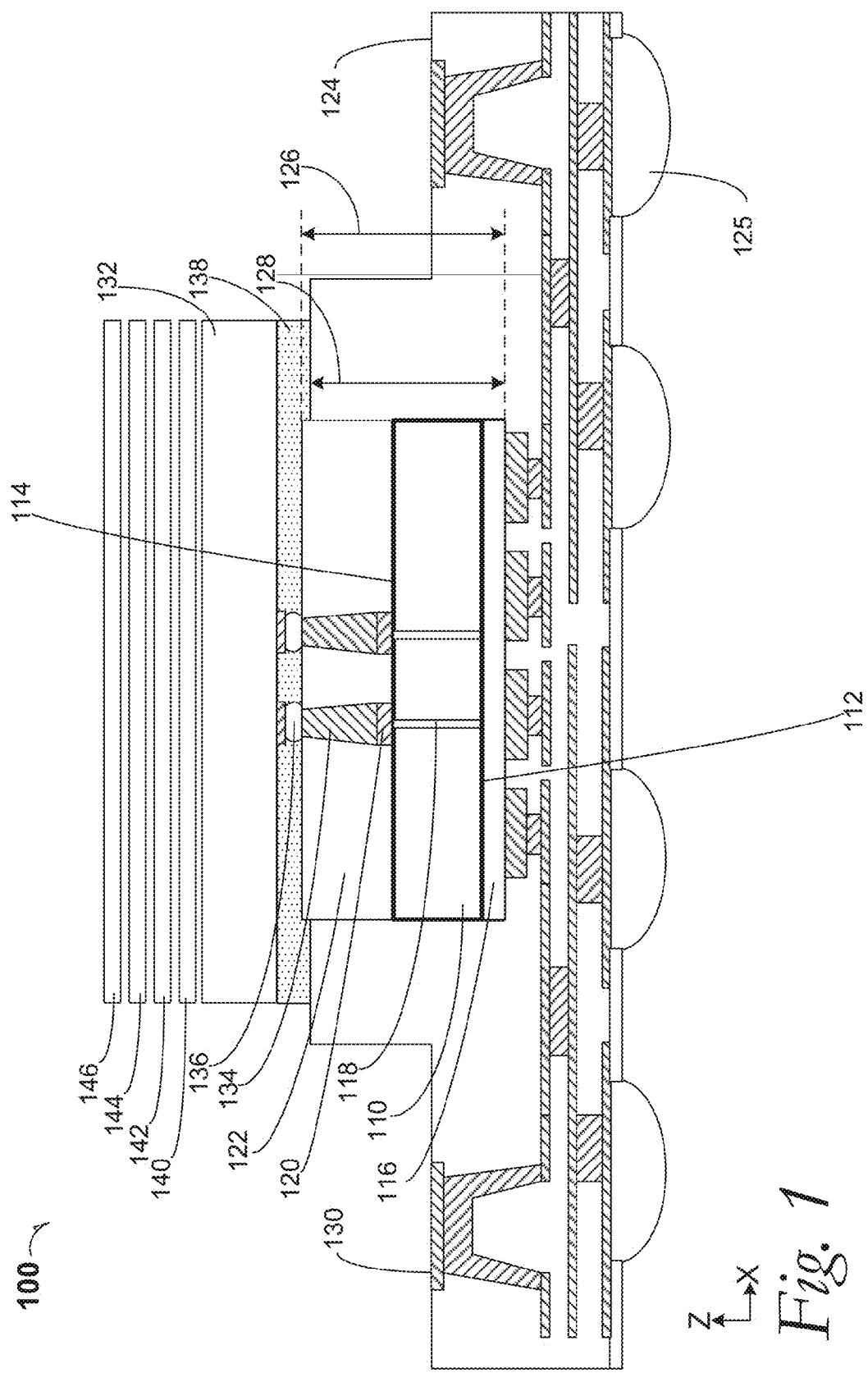
FIG. 1 is a cross-section elevation of an apparatus that includes an embedded die with a controlled-deposit solder coupling according to an example embodiment.

FIG. 1 is a cross-section elevation of an apparatus 100 that includes an embedded die 110 with a controlled-deposit solder coupling 134 according to an example embodiment. The embedded die 110 includes an active surface 112 and a backside surface 114. A front-end (FE) metallization 116 is disposed on the active surface 112. A through-silicon via (TSV) 118 is disposed in the embedded die 110 and the TSV 118 contacts a TSV contact 120 on the backside surface 114.

Affixing the embedded die 110 includes using a die backside film (DBF) 122, which is sticky at useful processing temperatures. In an embodiment, the embedded die 110 is disposed in a coreless, bumpless build-up layer (BBUL-C) substrate 124 with land-side bumps 125. It can be seen that the DBF 122 attains a DBF height 126 above the FE metallization 116 and the BBUL-C substrate 124 also attains a BBUL-C height 128 above the FE metallization 116. In an embodiment, the DBF height 126 is greater than the BBUL-C height 128, as illustrated. In an embodiment, the DBF height 126 is the same as the BBUL-C height 128. In an embodiment, the DBF height 126 is less than the BBUL-C height 128.

In an embodiment, a hybrid of some DBF 122 and some underfill 138 is formed. For example, the DBF 122 may be partially removed and in combination with a complement of underfill 138, a useful warpage resistance may result from the hybrid. In an embodiment, some of the DBF 122 starts with the DBF height 126 being a first height, followed by a second height that is the result of a partially ashing out of the DBF 122. For example, the DBF 126 is ashed to result in a 5 micrometer (µm) thickness (Z-direction). The 5 µm thickness is less than the BBUL-C height 128. Thereafter, a capillary underfilling (CUF) process is carried out. The resulting structure of a partially removed DBF and complementary underfill may be optimized for a given useful stiffness. Additionally, DBF coefficient of thermal expansion (CTE) and underfill CTE can be engineered both intrinsically as well as be modulated in its dominance by its final thickness.

The BBUL-C substrate 124 is depicted with incidental internal conductive layers and vias along with the land-side bumps 125. In an embodiment, the BBUL-C substrate 124 is a package-on-package (POP) BBUL-C substrate 124. In this embodiment, the BBUL-C substrate 124 has POP bond pads 130 that are provided for electrical communication to a POP package (not pictured).

Assembly of the embedded die 110 to a subsequent die 132 is accomplished by filling a conductive material 134 into a recess 123 (see, e.g., recess 123 in FIG. 2b) that is disposed in the DBF 122, followed by mating the subsequent die 132 at an electrical bump 136. Thereafter, an underfill material 138 is flowed between the DBF 122 and the subsequent die 132. The conductive material 134 may also be referred to as a controlled-deposit solder coupling 134 according to an example embodiment.

It may now be seen that other dice may be similarly assembled as the subsequent die 132. For example, a second die 140 is depicted in compressed, simplified vertical (Z-direction) scale and also simplified form (without illustrated controlled-deposit solder couplings). In an embodiment, the second die 140 is a TSV die that is mounted upon the subsequent die 132, where the subsequent die 132 also has a DBF that has been patterned according to any disclosed embodiment. Similarly, a third die 142 may be mounted on the second die 140, where the second die 140 is also a TSV die with a DBF that has been patterned according to any disclosed embodiment. A fourth die 144 and a fifth die 146 is also depicted by way of non-limiting example embodiment. In an embodiment, the fourth die 144 is a TSV die that is coupled to the third die 142 with a disclosed controlled-deposit solder coupling and the fifth die 146 is a simple flip chip die.

Also, the second die 140 may be located below the BBUL-C height 128 such that the first die 110, the subsequent die 132, and the second die 140 are all effectively embedded within the form factor of the BBUL-C substrate 124. It may now be understood that at least one die may be stacked above the subsequent die 132 but it would not be effectively embedded within the form factor of the BBUL-C substrate 124.

In an embodiment, the first die 110 is a logic die and the subsequent die 132 is a memory die. Location of the TSV 118 and patterning of the DBF 122 is done to interface a pin-out layout of the logic die 110 with a pin-out layout of the memory die 132. This may be called a logic-to-memory interface (LMI). In an embodiment, the first die 110 is a logic die and the subsequent die 132 is also a logic die. Location of the TSV 118 and patterning of the DBF 122 is done to interface a pin-out layout of the logic die 110 with pin-out layout of the subsequent logic die 132. This may be called a logic-to-logic interface (LLI).

In an embodiment, the first die 110 and the subsequent die 132 are logic dice with an LLI therebetween that uses a controlled-deposit solder coupling embodiment, and the second die 140 is a memory die with an LMI between the subsequent die 132 and the second die 140 that uses a controlled-deposit solder coupling embodiment. Location of the TSV 118 and patterning of the DBF 122 is done to interface pin-out layout of the logic die 110 with pin-out layout of the subsequent logic die 132, and a similar DBF on the subsequent die 132 is patterned to match interface pin-out layout of the subsequent logic die 132 with pin-out layout of the memory die 140.

It may now be appreciated that the stack of five dice 132, 140, 142, 144, and 146 is representative of LMI embodiments. It may now be appreciated that the stack of five dice 132, 140, 142, 144, and 146 is representative of LLI and LMI embodiments. Similarly, it is observed that location of the entire stack, or a portion thereof, may be effectively embedded within the form factor of the BBUL-C substrate 124 according to useful embodiments.

Stacking of the subsequent die 132 upon the embedded first die 110 may be done by compression joining according to an embodiment. Other methods may be used for creating a 3D stack that uses the controlled-deposit solder coupling embodiments. In any event, mechanical integrity and electronic contact integrity are increased by use of the controlled-deposit solder coupling embodiments. Additionally, overmolding of mold material may be eliminated where the integrity of the controlled-deposit solder coupling embodiments is relied upon such that only underfilling is necessary to create useful and reliable physical bonds and electronic contacts. Further, a lessened Z-height may be achieved by using thinned die and TSV technologies to create at least the embedded first die 110 and the subsequent die 132.

Figure 2A:
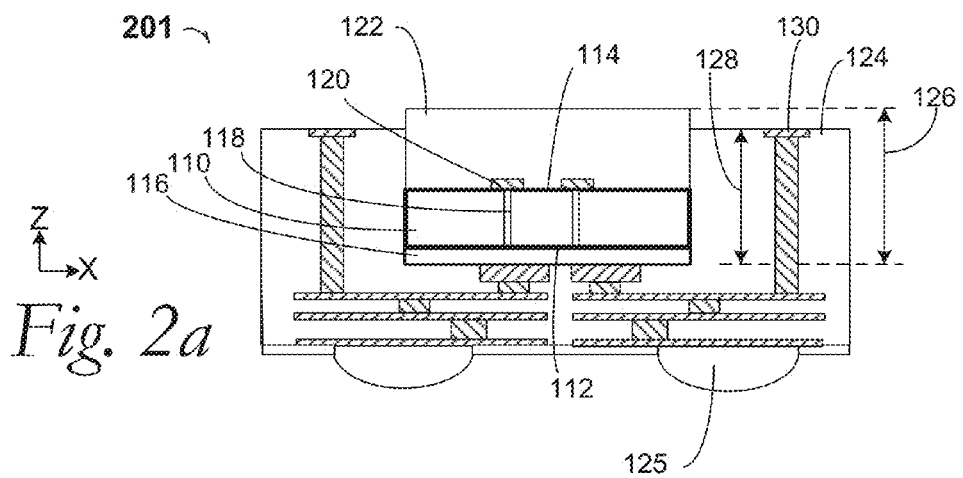
FIG. 2a is a cross-section elevation of an embedded die during formation of a controlled-deposit solder coupling according to an example embodiment.

FIG. 2a is a cross-section elevation of an embedded die apparatus 201 during formation of a controlled-deposit solder coupling according to an example embodiment. The apparatus 201 may be considered to be an embedded first die 110 disposed in a different embodiment of the BBUL-C 124 depicted in FIG. 1.

The embedded die 110 includes an active surface 112 and a backside surface 114. An FE metallization 116 is disposed on the active surface 112. A TSV 118 is disposed in the embedded die 110 and the TSV 118 contacts a TSV contact 120 on the backside surface 114.

A DBF 122 is shown extending above the BBUL-C substrate 124. It can be seen that the DBF 122 attains a DBF height 126 above the FE metallization 116 and the BBUL-C substrate 124 also attains a BBUL-C height 128 above the FE metallization 116. In an embodiment, the DBF height 126 is greater than the BBUL-C height 128, as illustrated. In an embodiment, the DBF height 126 is the same as the BBUL-C height 128. In an embodiment, the DBF height 126 is less than the BBUL-C height 128.

The BBUL-C substrate 124 is depicted with incidental internal conductive layers and vias along with the land-side bumps 125. In an embodiment, the BBUL-C substrate 124 is POP BBUL-C substrate 124. In this embodiment, the BBUL-C substrate 124 has POP bond pads 130 that are provided for electrical communication to a POP package (not pictured). Processing of the DBF 122 is carried out such as preparing it to open a recess therein that exposes the TSV contact 120.

Figure 2B:
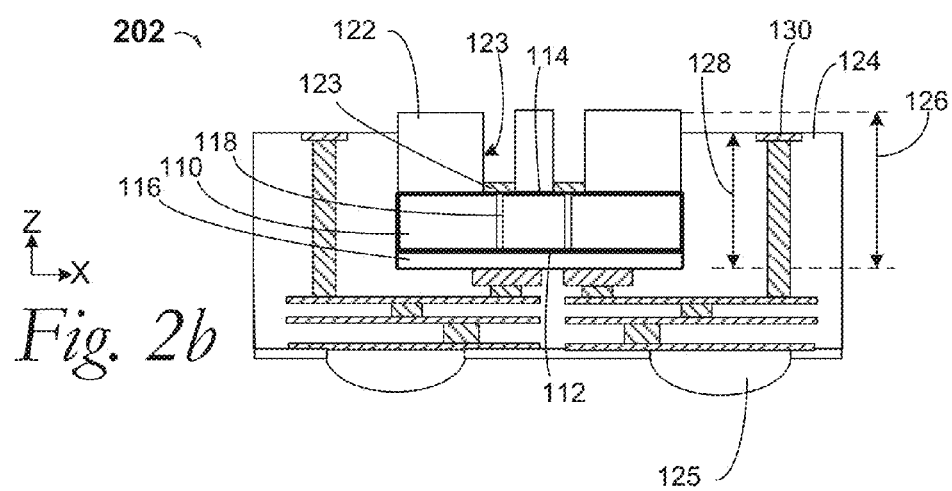
FIG. 2b is a cross-section elevation of the embedded die depicted in FIG. 2a during further processing according to an example embodiment.

FIG. 2b is a cross-section elevation of the embedded die depicted in FIG. 2a during further processing according to an example embodiment. The embedded die apparatus 202 has been processed to open a recess 123 that exposes the TSV contact 120. Consequently, the DBF 122 is an in situ mask for self-aligned placement of the conductive material 134 depicted in FIG. 1. In an embodiment, laser drilling through the DBF 122 is carried out such as by using a $CO_2$ laser drill. The shape of the recess 123 may have a conical form that is characteristic of a $CO_2$ laser drill process in an organic film that makes up the DBF 122. In an embodiment, a controlled ultraviolet (UV) process is carried out to form the recess 123.

Figure 2C:
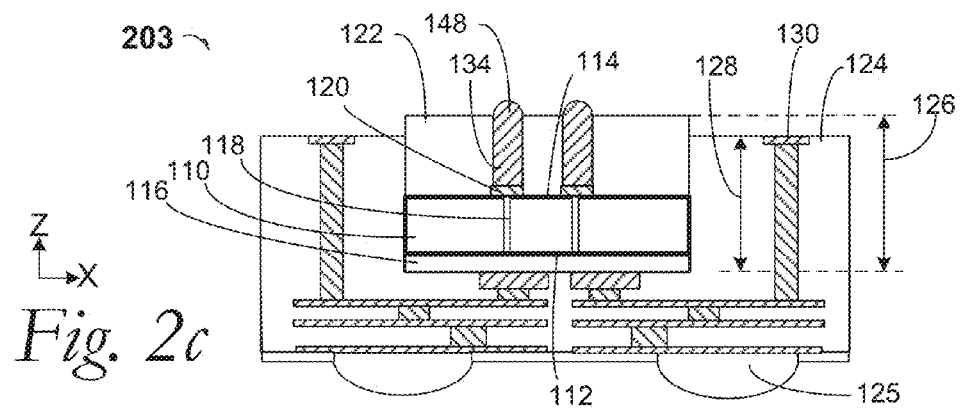
FIG. 2c is a cross-section elevation of the embedded die depicted in FIG. 2b during further processing according to an example embodiment.

FIG. 2c is a cross-section elevation of the embedded die depicted in FIG. 2b during further processing according to an example embodiment. The embedded die apparatus 203 has been processed by filling a solder-on-die material 134 into the recess 123 (FIG. 2b). The solder-on-die material 134 is conductive material that contacts the TSV contact 120. In an embodiment, the solder-on-die material 134 has a topology 148 that extends above the DBF height 126 such that an abundance of solder material is presented above the DBF height 126. The solder-on-die material 148 may be referred to as a dome-top form factor 148 where some solder material extends above the solder-on-die material 148. The dome-top form factor is useful to present a smaller tip dome top of the solder-on-die material 134 such that less epoxy flux filler, if any, must be used. As such, the dome-top form factor 148 may also be referred to as forming added solder to the conductive material in abundance at the DBF level 126. Consequently, "at a level" may be understood to be at the DBF level 126 of the DBF 122.

Figure 2D:
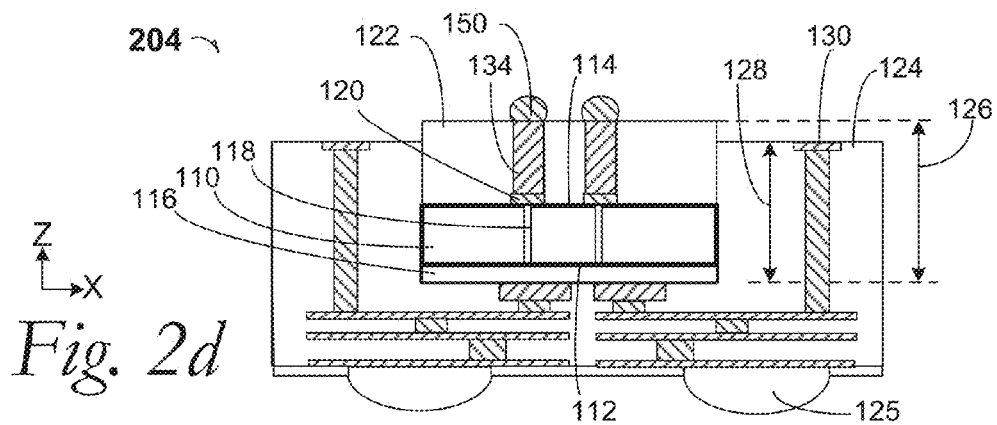
FIG. 2d is a cross-section elevation of the embedded die depicted in FIG. 2b during further processing according to an example embodiment.

FIG. 2d is a cross-section elevation of the embedded die depicted in FIG. 2b during further processing according to an example embodiment. The embedded die apparatus 204 has been processed by filling a solder-on-die material 134 into the recess 123 (FIG. 2b). In an embodiment, the solder-on-die material 134 has been added to with discrete added solder 150 that has a topology that extends above the DBF height 126 such that an abundance of solder material is presented at a level of the DBF, particularly above the DBF height 126. The solder-on-die material 134 may be referred to as a dome-top form factor where some discrete added solder 150 extends above the solder-on-die material 134.

Formation of the conductive material that contacts the TSV contact may be done by any useful process.

Figure 9A:
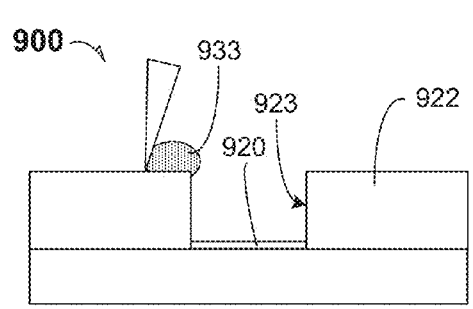
FIGS. 9a and 9b illustrate a process flow for inserting conductive material into a die-backside film recess according to an embodiment.
Figure 9B:
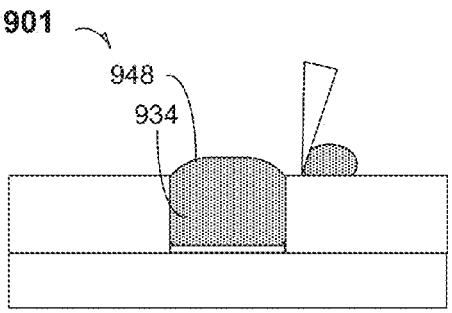

FIGS. 9a and 9b illustrate a useful process embodiment 900 for forming the conductive material 934 that contacts the TSV contact 920 as well as the dome-top form factor 948, which is also known as the added solder 148 that contacts the conductive material 948. A conductive material precursor 933 is being squeegeed into a recess 923 of a DBF 922. In FIG. 9b, the process has resulted in a controlled-deposit solder coupling 934 that may include a dome-top form factor 948, which may be formed based upon deposition techniques.

Figure 10A:
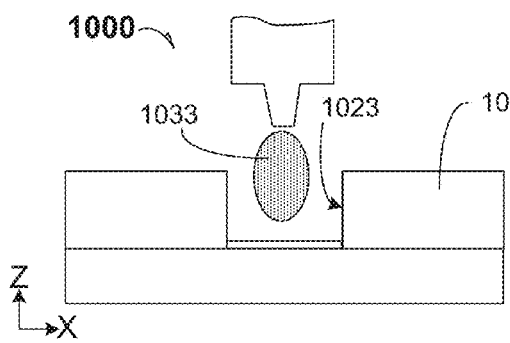
FIGS. 10a and 10b illustrate a process flow for inserting conductive material into a die-backside film recess according to an embodiment.
Figure 10B:
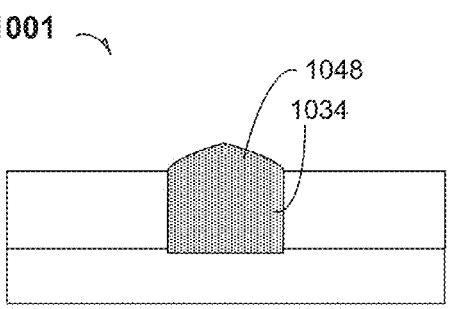

FIGS. 10a and 10b illustrate a useful process embodiment 1000 for forming the conductive material 1034 that contacts the TSV contact as well as the dome-top form factor 1048, which is also known as the added solder 1048 that contacts the conductive material 1034. A conductive material precursor 1033 is being injected by jet action into a recess 1023 of a DBF 1022. In FIG. 10b, the process has resulted in a controlled-deposit solder coupling 1034 that may include a dome-top form factor 1048, which may be formed based upon deposition techniques.

Figure 11A:
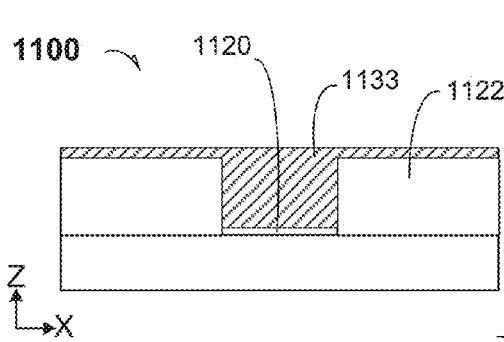
FIGS. 11a and 11b illustrate a process flow for inserting conductive material into a die-backside film recess according to an embodiment.
Figure 11B:
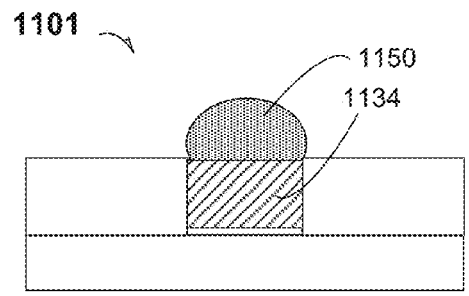

FIGS. 11a and 11b illustrate a useful process embodiment 1100 for forming the conductive material 1134 that contacts the TSV contact as well as the dome-top form factor 1150, which is also known as the discrete added solder 1150 that contacts the conductive material 1134. A conductive material precursor 1133 has been plated into the recess. The conductive material precursor also plates onto the upper surfaces of the DBF 1122. In an embodiment, the TSV contact 1120 is used for plating as a cathode, whether plating is electroless or electrolytic. The dome-top form factor 1150 is depicted as a solder paste that is mingled with a fugitive organic carrier. Further processing such as reflow may be done to convert the solder paste of the dome-top form factor 1150 into a substantially reflowed solder. In FIG. 11b, the process has resulted in a controlled-deposit solder coupling 1134 that may include a dome-top form factor 1150, which may be formed based upon deposition techniques such as jet action.

Figure 2E:
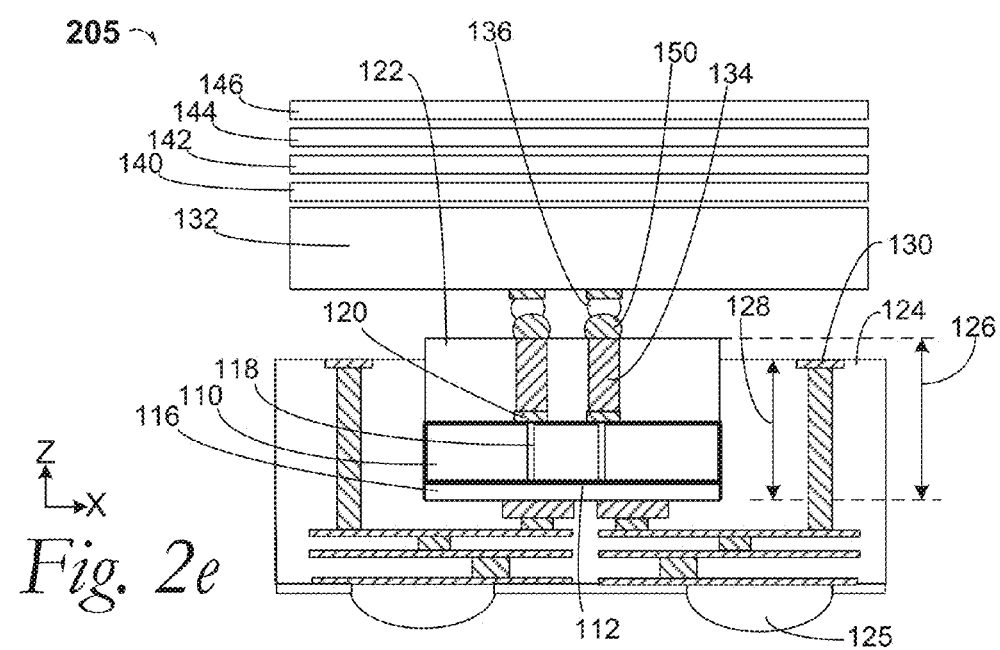
FIG. 2e is a cross-section elevation of the embedded die depicted in FIG. 2d during further processing according to an example embodiment.

FIG. 2e is a cross-section elevation of the embedded die depicted in FIG. 2d during further processing according to an example embodiment. The embedded die apparatus 205 has been processed by mating the subsequent die 132 to the discrete added solder 150 that is the dome-top form factor added to the conductive material 134. The subsequent die 132 also has an electrical bump 136. In combination with the added solder 150, the electrical bump 136 of the subsequent die 132 makes a useful contact between the embedded die 110 and the subsequent die 132.

Assembly of the embedded die 110 to the subsequent die 132 has been accomplished by filling the conductive material 134 into the recess that is disposed in the DBF 122, followed by mating the subsequent die 132 at the electrical bump 136. Thereafter, an underfill material 138 is flowed between the DBF 122 and the subsequent die 132 as seen in FIG. 1. In an embodiment, the underfilling process is carried out by CUF processing.

Figure 3B:
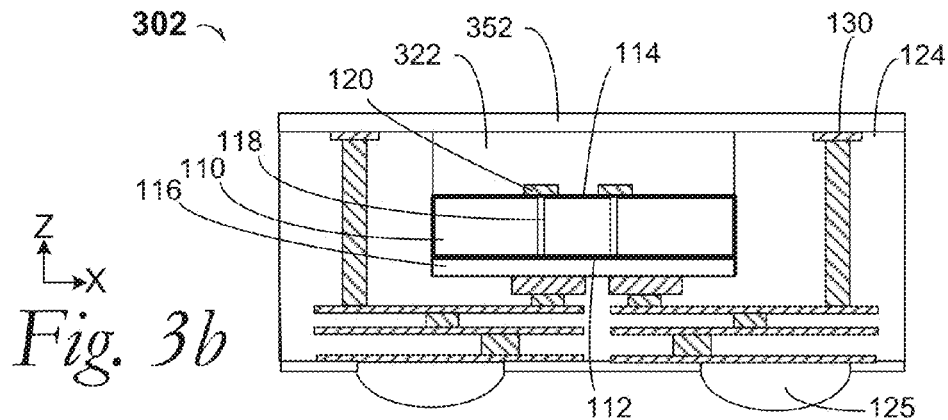
FIG. 3b is a cross-section elevation of the embedded die depicted in FIG. 2a during further processing according to an example embodiment.

FIG. 3b is a cross-section elevation of the embedded die depicted in FIG. 2a during further processing according to an example embodiment. The embedded die apparatus 302 is processed with a soft mask 352 and a light-reactive DBF 322. Other structures may be similar to those depicted in the series 2 FIGs. In an embodiment, the soft mask 352 has been spin-on processed and cured. In an embodiment, the soft mask 352 is a dry-film resist lamination.

Figure 3C:
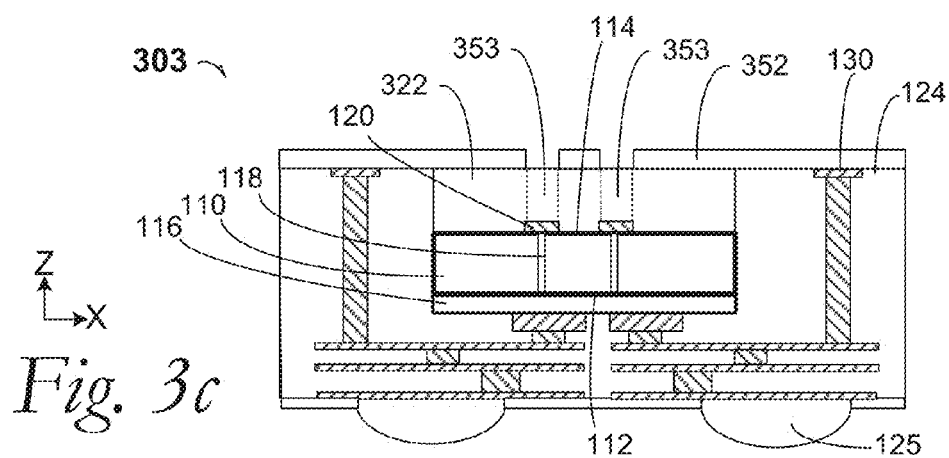
FIG. 3c is a cross-section elevation of the embedded die depicted in FIG. 3b during further processing according to an example embodiment.

FIG. 3c is a cross-section elevation of the embedded die depicted in FIG. 3b during further processing according to an example embodiment. The embedded die apparatus 303 has been processed by patterning opens in the soft mask 352 and by treating the light-reactive DBF 322 such that affected areas 353 have been formed above the TSV contacts 120.

Figure 3D:
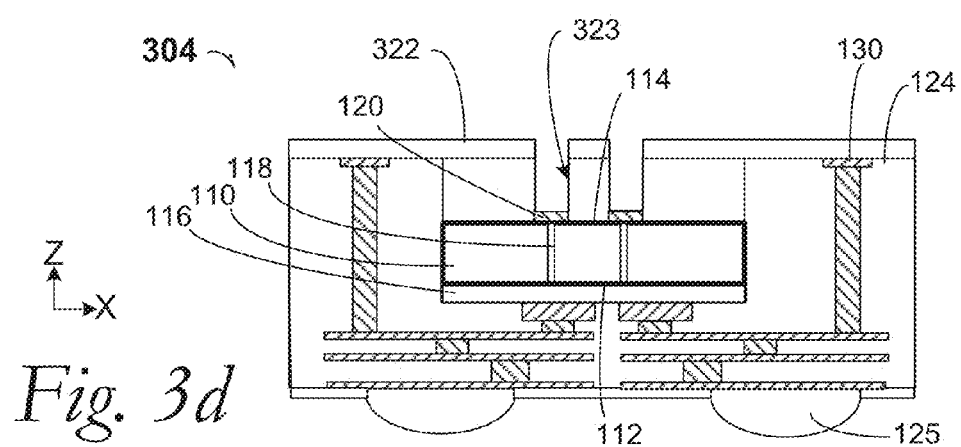
FIG. 3d is a cross-section elevation of the embedded die depicted in FIG. 3c during further processing according to an example embodiment.

FIG. 3d is a cross-section elevation of the embedded die depicted in FIG. 3c during further processing according to an example embodiment. The embedded die apparatus 304 has been processed by rinsing the affected areas 353 (FIG. 3c) such that the TSV contacts 120 are exposed in recesses 323. Processing may therefore continue by removal of the soft mask 322 and filling the recesses 323 according to any of the disclosed embodiments. Further processing may therefore include mating a subsequent die to the added solder form factor, followed by forming an underfill material between the DBF 322 and the subsequent die.

It may be appreciated that similar to the series 2 embodiments illustrated in FIGS. 2a-2e, the DBF 322 may attain any disclosed DBF height above the FE metallization 116 in comparison to the BBUL-C height 128 above the FE metallization 116. In an embodiment, the fourth die 144 is a TSV die that is coupled to the third die 142 with a disclosed controlled-deposit solder coupling and the fifth die 146 is a simple flip chip die.

Also, the second die 140 may be located below the BBUL-C height 128 such that the first die 110, the subsequent die 132, and the second die 140 are all effectively embedded within the form factor of the BBUL-C substrate 124. It may now be understood that at least one die may be stacked above the subsequent die 132 but it would not be effectively embedded within the form factor of the BBUL-C substrate 124.

Figure 4B:
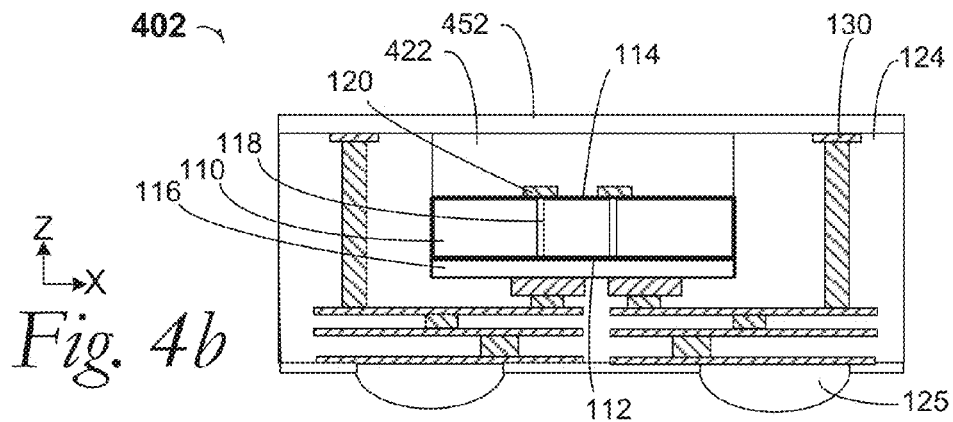
FIG. 4b is a cross-section elevation of the embedded die depicted in FIG. 2a during further processing according to an example embodiment.

FIG. 4b is a cross-section elevation of the embedded die depicted in FIG. 2a during further processing according to an example embodiment. The embedded die apparatus 402 is processed with a hard mask 452 that overlies the DBF 422. Other structures may be similar to those depicted in the series 2 FIGs.

Figure 4C:
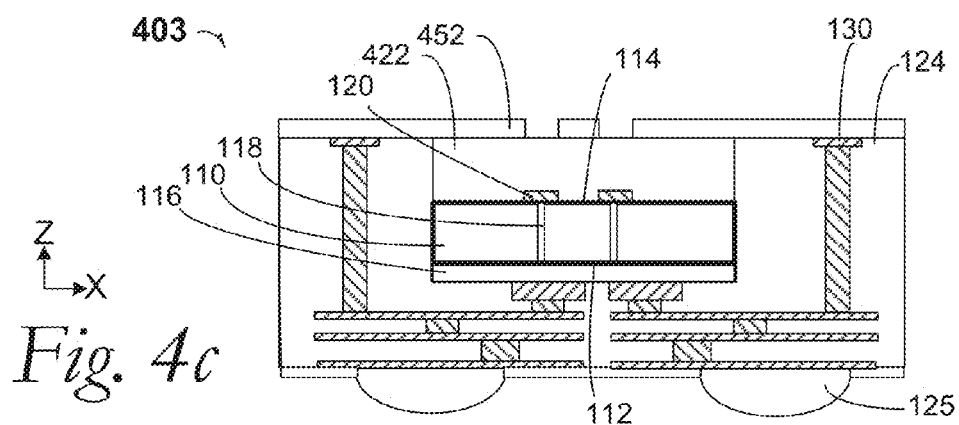
FIG. 4c is a cross-section elevation of the embedded die depicted in FIG. 4b during further processing according to an example embodiment.

FIG. 4c is a cross-section elevation of the embedded die depicted in FIG. 4b during further processing according to an example embodiment. The embedded die apparatus 403 has been processed by patterning opens in the hard mask 452 in preparation for an etching process that will stop on the TSV contact 120.

Figure 4D:
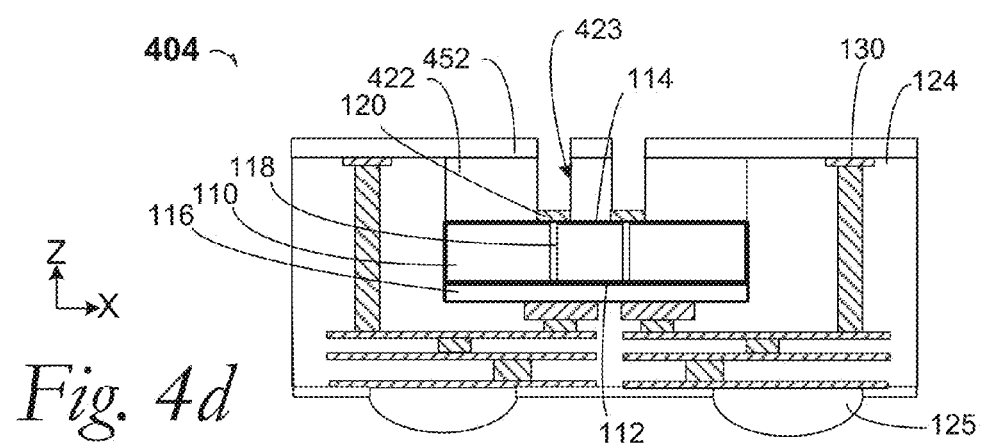
FIG. 4d is a cross-section elevation of the embedded die depicted in FIG. 4c during further processing according to an example embodiment.

FIG. 4d is a cross-section elevation of the embedded die depicted in FIG. 4c during further processing according to an example embodiment. The embedded die apparatus 404 has been processed by directional etching through the hard mask 452 to open recesses 423 that expose the TSV contacts 120. Processing may therefore continue by removal of the hard mask 422 and filling the recesses 423 according to any of the disclosed embodiments. Further processing may therefore include mating a subsequent die to the added solder form factor, followed by forming an underfill material between the DBF 422 and the subsequent die.

It may be appreciated that similar to the series 2 embodiment illustrated in FIGS. 2a-2e, the DBF 422 may attain any disclosed DBF height above the FE metallization 116 in comparison to the BBUL-C height 128 above the FE metallization 116. In an embodiment, the fourth die 144 is a TSV die that is coupled to the third die 142 with a disclosed controlled-deposit solder coupling and the fifth die 146 is a simple flip chip die.

Also, the second die 140 may be located below the BBUL-C height 128 such that the first die 110, the subsequent die 132, and the second die 140 are all effectively embedded within the form factor of the BBUL-C substrate 124. It may now be understood that at least one die may be stacked above the subsequent die 132 but it would not be effectively embedded within the form factor of the BBUL-C substrate 124.

FIG. 5 is a cross-section elevation of an apparatus that includes an embedded die with a controlled-deposit solder coupling according to an example embodiment. Structures depicted in FIG. 5 are similar to those depicted in FIG. 1, with the addition that the underfill process is altered. It can be seen in FIG. 5 that the underfill material 538 has filled into a space that has no remaining DBF. As a consequence of this process embodiment, the underfill material 538 may be selected to act as the sole spacer structure between the die backside surface 114 and the subsequent die 532.

Vertical spacing may still be controlled by differences between the DBF height 126 above the FE metallization 116 and the BBUL-C height 128 above the FE metallization 116. Actual spacing between the die backside 114 and the bond pads of the subsequent die 532 may be controlled by the DBF height 126 bring greater than the BBUL-C height 128.

Figure 6D:
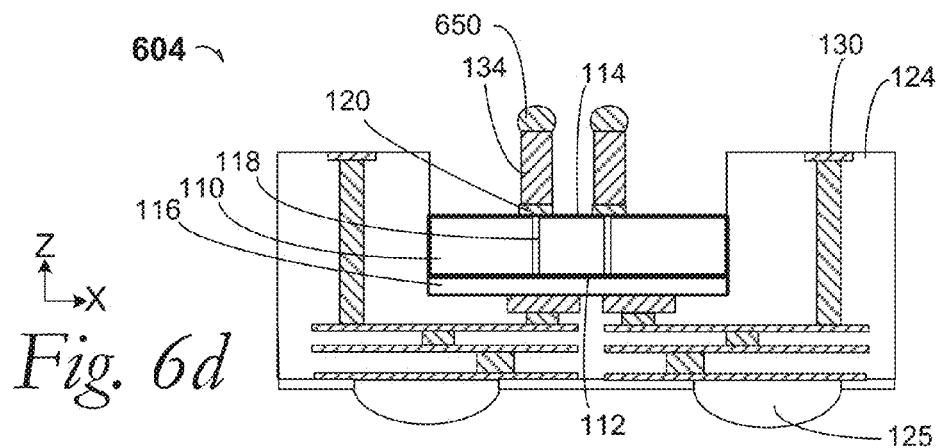
FIG. 6d is a cross-section elevation of an embedded die during formation of a controlled-deposit solder coupling that may follow previously disclosed processing after a controlled-deposit solder processing has been accomplished according to an example embodiment.

FIG. 6d is a cross-section elevation of an embedded die during formation of a controlled-deposit solder coupling that may follow previously disclosed processing after a controlled-deposit solder processing has been accomplished according to an example embodiment. The controlled-deposit solder coupling 134 has been formed including a form of the added solder (in this example embodiment the discrete added solder 650) dome-top form factor.

In an embodiment, the DBF has been removed by a plasma-ashing process according to known technique. Processing may cause roughening of the surfaces of the controlled-deposit solder coupling 134 and the discrete added solder 650 Such processing may also remove incidental oxides on the surfaces of the controlled-deposit solder coupling 134 and the discrete added solder 650, which makes more useful contact surfaces for mating with a subsequent-die bump.

Figure 6E:
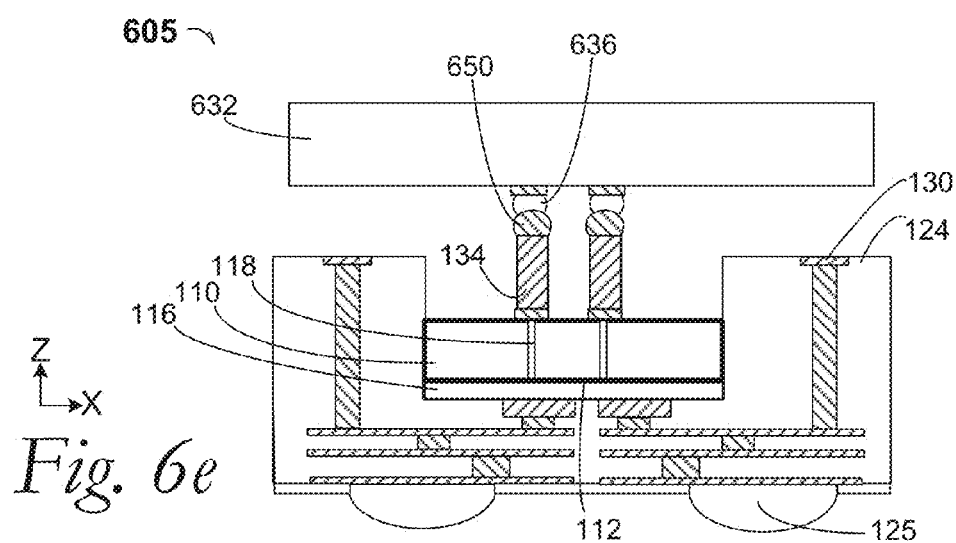
FIG. 6e is a cross-section elevation of the embedded die depicted in FIG. 6d during further processing according to an example embodiment.

FIG. 6e is a cross-section elevation of the embedded die depicted in FIG. 6d during further processing according to an example embodiment. The subsequent die 632 has been mated to the added solder 650 at the electrical bump 636. By use of this embodiment, sufficient solder is present to make a useful connection between the embedded die 110 and the subsequent die 632. It may now be appreciated that processing to achieve the configuration in FIG. 6e may be done by first removing any DBF. Similarly, it may now be understood that processing to achieve the configuration in FIG. 6e may be done by using the DBF height (such as the DBF height 126 depicted in FIG. 1) as a fixed distance, followed by ashing the DBF after mating the subsequent die 632 to the embedded die 110.

After the structure depicted in FIG. 6e is achieved, processing may then continue by underfilling to achieve the apparatus depicted in FIG. 5. In an embodiment, fluxless bonding of the electrical bump 136, depicted in FIG. 5, with the discrete added material 650 is carried out. Similarly in an embodiment, fluxless bonding of the electrical bump 136, depicted in FIG. 5, with the added material such as the dome-top form factor 148 depicted in FIG. 2c is carried out. In an embodiment, the underfilling process is carried out by CUF action.

Figure 7:
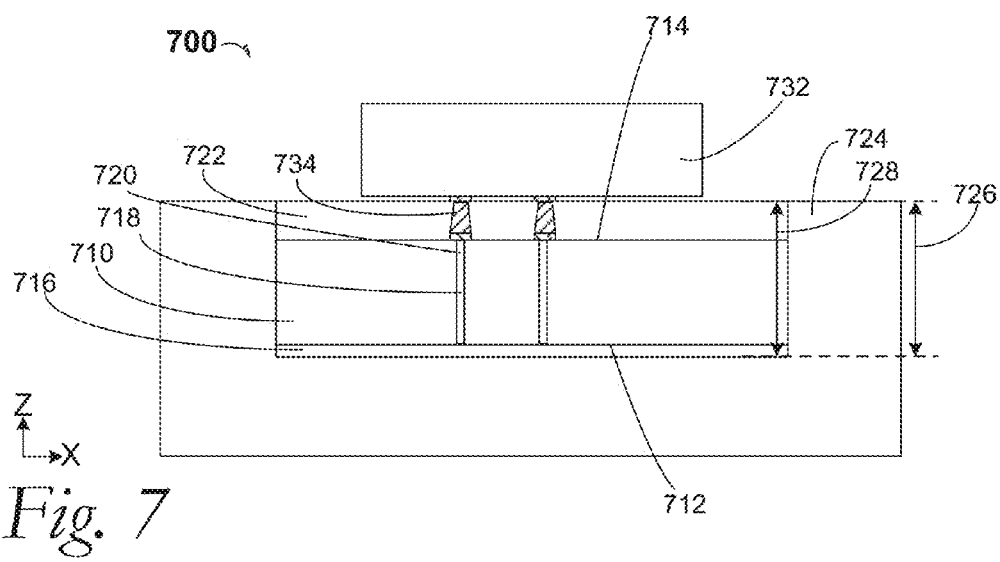
FIG. 7 is a cross-section elevation of an apparatus that includes an embedded die with a controlled-deposit solder coupling according to an example embodiment.

FIG. 7 is a cross-section elevation of an apparatus 700 that includes an embedded die 710 with a controlled-deposit solder coupling 734 according to an example embodiment. The embedded die 710 includes an active surface 712 and a backside surface 714. An FE metallization 716 is disposed on the active surface 712. A TSV 718 is disposed in the embedded die 710 and the TSV 718 contacts a TSV contact 720 on the backside surface 714.

The apparatus 700 includes a subsequent die 732 that can be seen to have a lateral (X-direction) dimension that is less than that of the DBF 722. Consequently, the entire subsequent die 732 may rest upon the DBF 722 during mating thereof. This embodiment facilitates useful pre-selected spacing between the die backside and the active surface of the subsequent die 732. It can be seen the DBF 722 attains a DBF height 726 above the FE metallization 716 and the BBUL-C substrate 724 also attains a BBUL-C height 728 above the FE metallization 716. In an embodiment, the DBF height 726 is greater than the BBUL-C height 728. In an embodiment, the DBF height 726 is the same as the BBUL-C height 728, as illustrated. In an embodiment, the DBF height 726 is less than the BBUL-C height 728.

In an embodiment, the embedded die 710 is disposed in a BBUL-C substrate 724 similar to other embodiments described and illustrated. Assembly of the embedded die 710 to the subsequent die 732 is accomplished by filling a conductive material 734 into a recess that is disposed in the DBF 722, followed by mating the subsequent die 732 at a DBF height 726 that avoids secondary height adjustment by virtue of the DBF having a pre-selected. The conductive material 734 may also be referred to as a controlled-deposit solder coupling 734 according to an example embodiment.

It may now be appreciated that die stacks may include non-equivalent interface combinations such as LMI, LMI with additional MMI$^n$ where n equals 1 to 3, LLI, LLI with additional MMI<sup>n</sup> where n equals 1 to 4, and LLI² with additional LMI<sup>n</sup>. where n equals 1 to 3.

Similarly, it may now be appreciated that LMI, LLI, and MMI permutations so disclosed may be formed with the second die 140 located below the BBUL-C height 128 such that the first die 110, the subsequent die 132, and the second die 140 are all effectively embedded within the form factor of the BBUL-C substrate 124. It may now be understood that at least one die may be stacked above the subsequent die 132 but it would not be effectively embedded within the form factor of the BBUL-C substrate 124.

Figure 8:
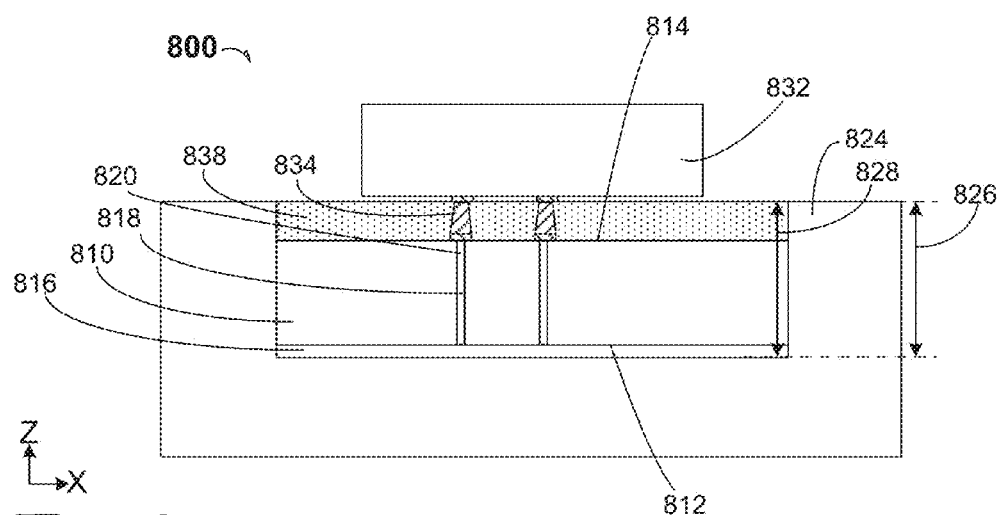
FIG. 8 is a cross-section elevation of an apparatus that includes an embedded die with a controlled-deposit solder coupling according to an example embodiment.

FIG. 8 is a cross-section elevation of an apparatus 800 that includes an embedded die 810 with a controlled-deposit solder coupling 834 according to an example embodiment. The embedded die 810 includes an active surface 812 and a backside surface 814. An FE metallization 816 is disposed on the active surface 812. A TSV 818 is disposed in the embedded die 810 and the TSV 818 contacts a TSV contact 820 on the backside surface 814.

The apparatus 800 includes a subsequent die 832 that can be seen to have a lateral (X-direction) dimension that is less than that of an underfill material 738 that has entirely replaced a DBF such as the DBF 722 depicted in FIG. 7. Consequently, the entire subsequent die 832 may rest upon the underfill material 832 after mating thereof. This embodiment facilitates useful pre-selected spacing between the die backside and the active surface of the subsequent die 832. It can be seen the underfill material 832 attains a DBF height 826 above the FE metallization 816 and the BBUL-C substrate 824 also attains a BBUL-C height 828 above the FE metallization 816. In an embodiment, the DBF height 826 is greater than the BBUL-C height 828. In an embodiment, the DBF height 826 is the same as the BBUL-C height 828, as illustrated. In an embodiment, the DBF height 826 is less than the BBUL-C height 828.

In an embodiment, the embedded die 810 is disposed in a BBUL-C substrate 824 similar to other embodiments described and illustrated. Assembly of the embedded die 810 to the subsequent die 832 is accomplished by filling a conductive material 834 into a recess that is disposed in the DBF, followed by mating the subsequent die 832 at a DBF height 826 that avoids secondary height adjustment by virtue of the DBF having a pre-selected thickness. Thereafter, the DBF is removed such as by ashing and the underfill material 838 is flowed between the die backside surface 814 and the subsequent die 832. The conductive material 834 may also be referred to as a controlled-deposit solder coupling 834 according to an example embodiment.

It may now be appreciated that die stacks may include non-equivalent interface combinations such as LMI, LMI with additional MMI<sup>n</sup> where n equals 1 to 3, LLI, LLI with additional MMI<sup>n</sup> where n equals 1 to 4, and LLI² with additional LMI<sup>n</sup> where n equals 1 to 3.

Similarly, it may now be appreciated that LMI, LLI, and MMI permutations so disclosed may be formed with the second die 140 located below the BBUL-C height 128 such that the first die 110, the subsequent die 132, and the second die 140 are all effectively embedded within the form factor of the BBUL-C substrate 124. It may now be understood that at least one die may be stacked above the subsequent die 132 but it would not be effectively embedded within the form factor of the BBUL-C substrate 124.

Figure 12:
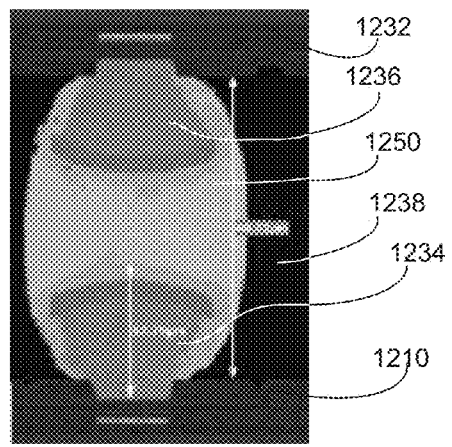
FIG. 12 is a computer reproduction of a photomicrograph according to an example embodiment.

FIG. 12 is a computer reproduction of a photomicrograph according to an example embodiment. An embedded first die 1210 has a connection on the die backside thereof with a controlled-deposit solder coupling 1234. A subsequent die 1232 is coupled to the embedded first die 1210 by an electrical bump 1236, and added solder such as discrete added solder 1250 is shown to fill voids in underfill material 1238 between the controlled-deposit solder coupling 1234 and the electrical bump 1236.

Figure 13:
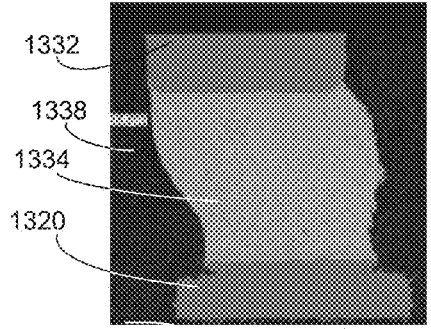
FIG. 13 is a computer reproduction of a photomicrograph according to an example embodiment.

FIG. 13 is a computer reproduction of a photomicrograph according to an example embodiment. A TSV contact 1320 that is part of an embedded first die has a connection with a controlled-deposit solder coupling 1334. A subsequent die 1332 is coupled to the TSV contact 1320 by a controlled-deposit solder coupling 1334 which included added solder (such as the dome-top form factor 148 seen in FIG. 2c) to fill voids in underfill material 1338.

Figure 14:
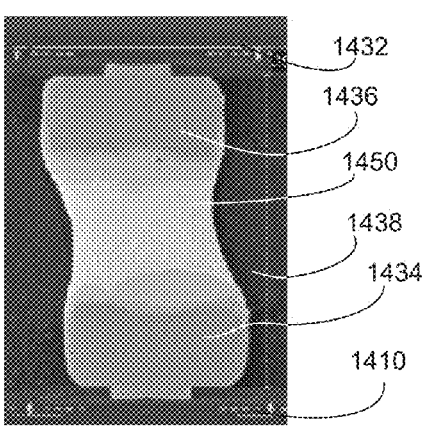
FIG. 14 is a computer reproduction of a photomicrograph according to an example embodiment.

FIG. 14 is a computer reproduction of a photomicrograph according to an example embodiment. An embedded first die 1410 has a connection on the die backside thereof with a controlled-deposit solder coupling 1434. A subsequent die 1432 is coupled to the embedded first die 1410 by an electrical bump 1436, and added solder such as discrete added solder 1450 is shown to fill voids in underfill material 1438 between the controlled-deposit solder coupling 1434 and the electrical bump 1436.

Figure 15:
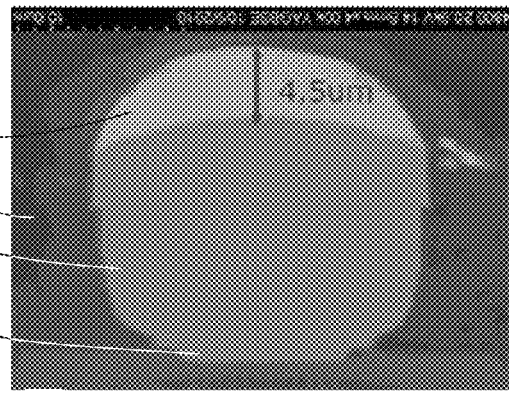
FIG. 15 is a computer reproduction of a photomicrograph according to an example embodiment.

FIG. 15 is a computer reproduction of a photomicrograph according to an example embodiment. A TSV contact 1520 that is part of an embedded first die has a connection with a controlled-deposit solder coupling 1534 that has added solder such as discrete added solder 1550 that is useful to fill voids in underfill material 1538.

Figure 16:
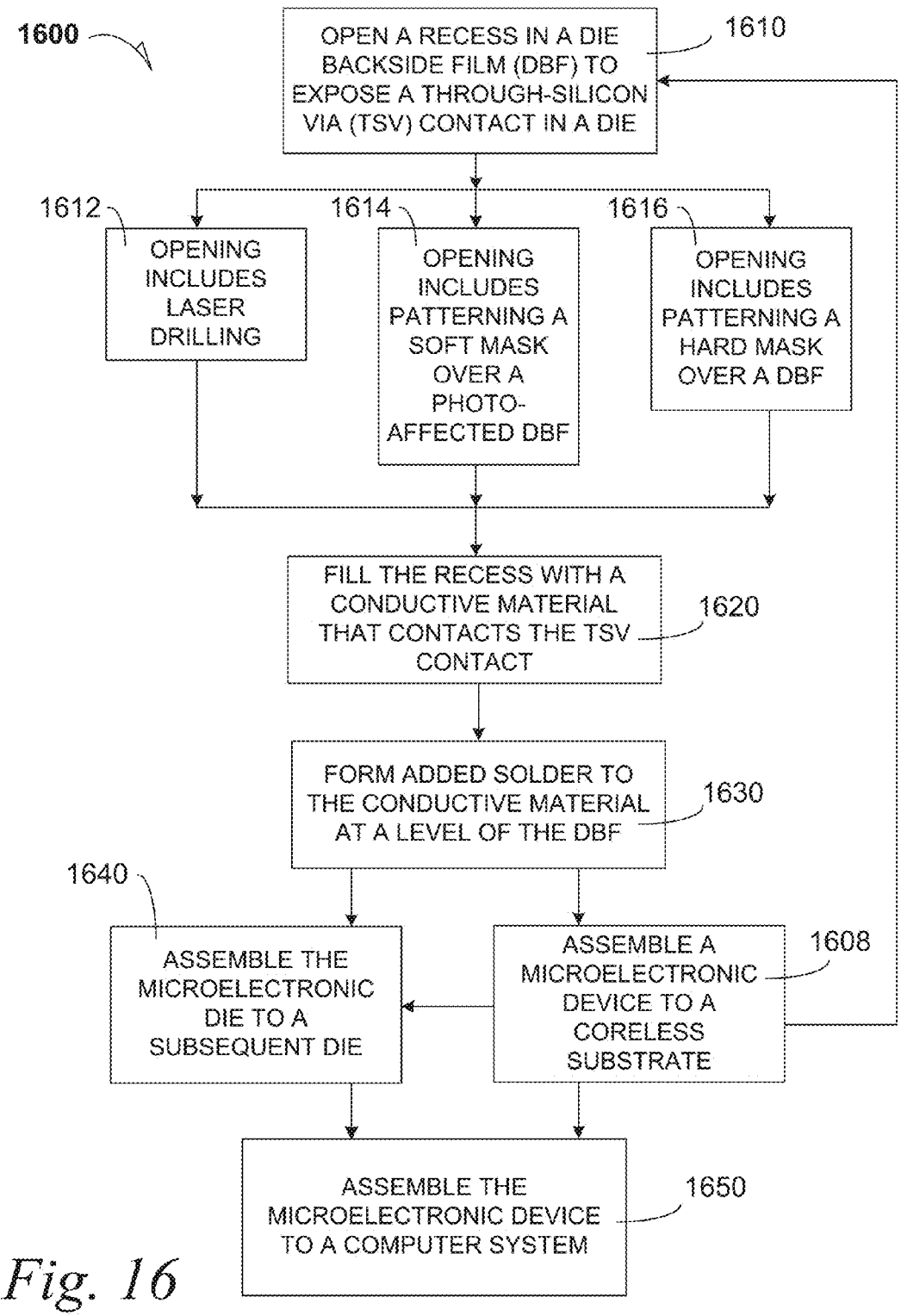
FIG. 16 is a process and method flow diagram according to an example embodiment.

FIG. 16 is a process and method flow diagram according to an example embodiment.

At 1608, the process includes assembling a microelectronic die to a coreless substrate. In a non-limiting example embodiment, the first die 110 is embedded in the BBUL-C 124. It may now be appreciated that this process may be selected to be after patterning opens in the DBF.

At 1610, the process includes opening a recess in a DBF to expose a TSV contact.

At 1612, the process includes opening the recess by laser drilling.

At 1614, the process includes opening the recess by patterning a soft mask over light-sensitive DBF material and rinsing affected areas of the DBF.

At 1616, the process includes patterning a hard mask over the DBF and opening the recess by a directional etch.

At 1620, the process includes filling the recess with a conductive material that contacts the TSV contact.

At 1630, the process includes forming added solder to the conductive material at a level of the DBF. In a non-limiting example embodiment, the added solder 148 is formed above the controlled-deposit solder coupling 134 as illustrated in FIG. 2c. In a non-limiting example embodiment, the discrete added solder 150 is formed above the controlled-deposit solder coupling 134 as illustrated in FIG. 2d.

At 1640, the process includes assembling the microelectronic die to a subsequent die. In a non-limiting example embodiment, the first die 110 is assembled to a subsequent die 132.

At 1650, the microelectronic device is assembled to a computing system. In a non-limiting example embodiment, the apparatus 100 including at least the BBUL-C, the first die 110, and the subsequent die 132 is assembled to a computer system such as the computer system 1700 depicted in FIG. 17.

Figure 17:
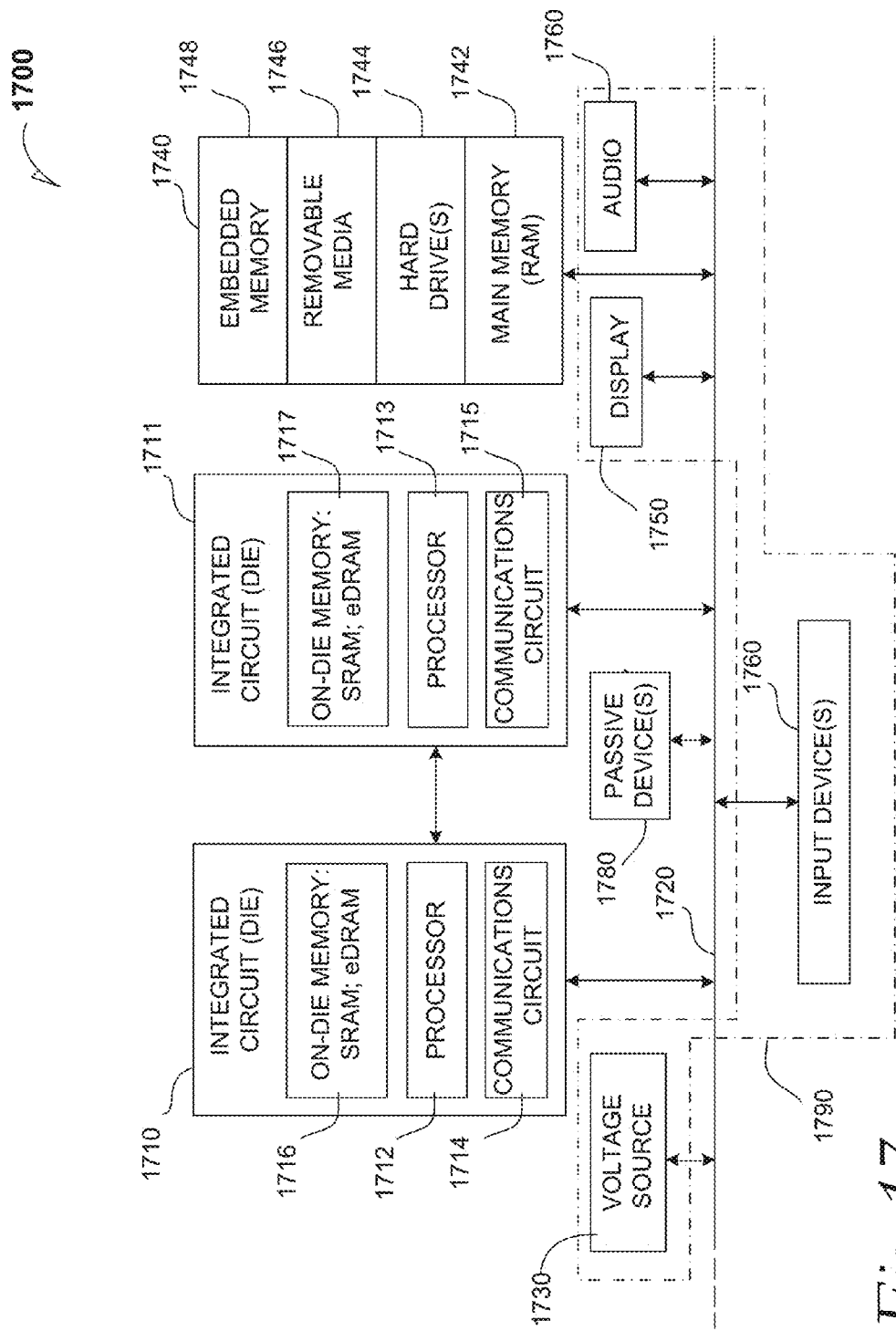
FIG. 17 is a schematic of a computer system according to example embodiments.

FIG. 17 is a schematic of a computer system according to an embodiment. The computer system 1700 (also referred to as the electronic system 1700) as depicted can embody a controlled-deposit solder coupling according to any of the several disclosed embodiments and their equivalents as set forth in this disclosure. An apparatus that includes a controlled-deposit solder coupling that is assembled to a computer system.

The computer system 1700 may be a smartphone. The computer system 1700 may be a tablet computer. The computer system 1700 may be a mobile device such as a notebook computer. The computer system 1700 may be a mobile device such as an ultrabook computer. The computer system 1700 may be a desktop computer. The computer system 1700 may be integral to an automobile. The computer system 1700 may be integral to a television. The computer system 1700 may be integral to a DVD player. The computer system 1700 may be integral to a digital camcorder.

In an embodiment, the electronic system 1700 is a computer system that includes a system bus 1720 to electrically couple the various components of the electronic system 1700. The system bus 1720 is a single bus or any combination of busses according to various embodiments. The electronic system 1700 includes a voltage source 1730 that provides power to an integrated circuit 1710. In some embodiments, the voltage source 1730 supplies current to the integrated circuit 1710 through the system bus 1720.

The integrated circuit 1710 is electrically coupled to the system bus 1720 and includes any circuit, or combination of circuits according to an embodiment. In an embodiment, the integrated circuit 1710 includes a processor 1712 that can be of any type of an apparatus that includes a controlled-deposit solder coupling embodiment. As used herein, the processor 1712 may mean any type of circuit such as, but not limited to, a microprocessor, a microcontroller, a graphics processor, a digital signal processor, or another processor. In an embodiment, SRAM embodiments are found in memory caches of the processor 1712. Other types of circuits that can be included in the integrated circuit 1710 are a custom circuit or an application-specific integrated circuit (ASIC), such as a communications circuit 1714 for use in non-equivalent wireless devices such as cellular telephones, smartphones, pagers, portable computers, two-way radios, and other electronic systems. In an embodiment, the processor 1710 includes on-die memory 1716 such as static random-access memory (SRAM). In an embodiment, the processor 1710 includes embedded on-die memory 1716 such as embedded dynamic random-access memory (eDRAM). Disclosed COB embodiments and their art-recognized equivalents are integral memory cells in the eDRAM.

In an embodiment, the integrated circuit 1710 is complemented with a subsequent integrated circuit 1711 such in any LLI, LMI, or MMI embodiment as set forth in this disclosure. In an embodiment, the subsequent integrated circuit 1711 is as a graphics processor or a radio-frequency integrated circuit or both. In an embodiment, the dual integrated circuit 1711 includes embedded on-die memory 1717 such as eDRAM with any disclosed controlled-deposit solder coupling embodiments. The dual integrated circuit 1711 includes an RFIC dual processor 1713 and a dual communications circuit 1715 and dual on-die memory 1717 such as SRAM. In an embodiment, the dual communications circuit 1715 is particularly configured for RF processing.

In an embodiment, at least one passive device 1780 is coupled to the subsequent integrated circuit 1711 such that the integrated circuit 1711 and the at least one passive device are part of the any apparatus embodiment that includes a controlled-deposit solder coupling that includes the integrated circuit 1710 and the integrated circuit 1711. In an embodiment, the at least one passive device is a sensor such as an accelerometer for a tablet or smartphone.

In an embodiment, the electronic system 1700 includes an antenna element 1782 such as any controlled-deposit solder coupling embodiment set forth in this disclosure. By use of the antenna element 1782, a remote device 1784 such as a television, may be operated remotely through a wireless link by an apparatus embodiment. For example, an application on a smart telephone that operates through a wireless link broadcasts instructions to a television up to about 30 meters distant such as by Bluetooth® technology. In an embodiment, the remote device(s) includes a global positioning system of satellites for which the antenna element(s) are configured as receivers.

In an embodiment, the electronic system 1700 also includes an external memory 1740 that in turn may include one or more memory elements suitable to the particular application, such as a main memory 1742 in the form of RAM, one or more hard drives 1744, and/or one or more drives that handle removable media 1746, such as diskettes, compact disks (CDs), digital variable disks (DVDs), flash memory drives, and other removable media known in the art. In an embodiment, the external memory 1740 is part of a POP package that is stacked upon an apparatus that includes a controlled-deposit solder coupling according to any disclosed embodiments. In an embodiment, the external memory 1740 is embedded memory 1748 such an apparatus that includes a controlled-deposit solder coupling according to any disclosed embodiment.

In an embodiment, the electronic system 1700 also includes a display device 1750, and an audio output 1760. In an embodiment, the electronic system 1700 includes an input device such as a controller 1770 that may be a keyboard, mouse, touch pad, keypad, trackball, game controller, microphone, voice-recognition device, or any other input device that inputs information into the electronic system 1700. In an embodiment, an input device 1770 includes a camera. In an embodiment, an input device 1770 includes a digital sound recorder. In an embodiment, an input device 1770 includes a camera and a digital sound recorder.

A foundation substrate 1790 may be part of the computing system 1700. The foundation substrate 1790 is a motherboard that supports an apparatus that includes a controlled-deposit solder coupling embodiment. In an embodiment, the foundation substrate 1790 is a board which supports an apparatus that includes a controlled-deposit solder coupling embodiment. In an embodiment, the foundation substrate 1790 incorporates at least one of the functionalities encompassed within the dashed line 1790 and is a substrate such as the user shell of a wireless communicator.

As shown herein, the integrated circuit 1710 can be implemented in a number of different embodiments, an apparatus that includes a controlled-deposit solder coupling according to any of the several disclosed embodiments and their equivalents, an electronic system, a computer system, one or more methods of fabricating an integrated circuit, and one or more methods of fabricating and assembling an apparatus that includes a controlled-deposit solder coupling according to any of the several disclosed embodiments as set forth herein in the various embodiments and their art-recognized equivalents. The elements, materials, geometries, dimensions, and sequence of operations can all be varied to suit particular I/O coupling requirements including controlled-deposit solder coupling embodiments and their equivalents.

Although a die may refer to a processor chip, an RF chip, an RFIC chip, or a memory chip may be mentioned in the same sentence, but it should not be construed that they are equivalent structures. Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

Terms such as "upper" and "lower" "above" and "below" may be understood by reference to the illustrated X-Z coordinates, and terms such as "adjacent" may be understood by reference to X-Y coordinates or to non-Z coordinates.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A process of bumping a die backside, comprising:
opening a recess in a die backside film (DBF) to expose a through-silicon via (TSV) contact in a die, the die including an active surface and a backside surface;
filling the recess with a conductive material that contacts the TSV contact; and
forming added solder to the conductive material at a level of the DBF, further including embedding the die in a coreless, bumpless build-up layer (BBUL-C) substrate, wherein the backside surface is exposed and the active surface is coupled to the BBUL-C substrate.

2. The process of claim 1, further including removing the DBF.

3. The process of claim 1, further including:
removing the DBF; and
coupling a subsequent die to the embedded die at the added solder.

4. The process of claim 1, further including:
removing the DBF;
coupling a subsequent die to the embedded die at the added solder; and
underfilling a material between the subsequent die and the embedded die by capillary underfill (CUF) action.

5. The process of claim 1, further including:
removing the DBF;
coupling a subsequent die to the embedded die at the added solder; and
underfilling a material between the subsequent die and the embedded die by epoxy flux action.

6. A process of bumping a die backside, comprising:
opening a recess in a die backside film (DBF) to expose a through-silicon via (TSV) contact in a die, the die including an active surface and a backside surface;
filling the recess with a conductive material that contacts the TSV contact; and
forming added solder to the conductive material at a level of the DBF, wherein the DBF has a first thickness, wherein the die is a first die, and the process further including:
coupling a subsequent die to the first die by seating the subsequent die upon the DBF such that the first thickness creates a selected offset between the first die and the subsequent die.

7. The process of claim 6, further including:
removing the DBF; and
underfilling a material between the subsequent die and the first die by capillary underfill (CUF) action.

8. The process of claim 6, wherein the DBF has a first thickness, wherein the die is a first die, and the process further including:
removing the DBF; and
underfilling a material between the subsequent die and the first die by epoxy flux action.

9. A process of bumping a die backside, comprising:
opening a recess in a die backside film (DBF) to expose a through-silicon via (TSV) contact in a die, the die including an active surface and a backside surface;
filling the recess with a conductive material that contacts the TSV contact; and
forming added solder to the conductive material at a level of the DBF, wherein the DBF has a first thickness, the process further including:
removing the DBF; and
underfilling an underfill material to contact at least one of the the conductive material and the added material.

10. The process of claim 9, the process further including:
removing a fraction of the DBF; and
underfilling an underfill material to contact at least one of the conductive material and the added material.

11. An apparatus comprising:
a die including a through-silicon via (TSV) disposed therein, the die including an active surface and a backside surface;
a TSV contact that contacts the TSV;
a die backside film (DBF) disposed on the backside surface;
a recess that exposes the TSV contact;
conductive material disposed in the recess that contacts the TSV contact; and
added solder that contacts the conductive material, wherein the added solder is disposed at a level of the DBF, wherein the die is an embedded die that is embedded in a coreless, bumpless build-up layer (BBUL-C) substrate, the apparatus further including a subsequent die coupled to the added solder.

12. The apparatus of claim 11, wherein the subsequent die is seated on the DBF.

13. The apparatus of claim 11, wherein the die is a first die, that apparatus further including a subsequent die coupled to the added solder, wherein the first die is a logic die with a first pin-out pitch, wherein the subsequent die is a logic die with a subsequent pin-out pitch, and wherein the first pin-out pitch matches the subsequent pin-out pitch.

14. The apparatus of claim 11, wherein the die is a first die, the apparatus further including a subsequent die coupled to the added solder, wherein the first die is a logic die with a first pin-out pitch, wherein the subsequent die is a memory die with a subsequent pin-out pitch, and wherein the first pin-out pitch is different from the subsequent pin-out pitch.

15. The apparatus of claim 11, wherein the die is an embedded die that is embedded in a coreless, bumpless build-up layer (BBUL-C) substrate, the apparatus further including:
a subsequent die coupled to the added solder, and wherein the embedded die and the subsequent die are coupled by:
the TSV contact;
the conductive material contacting the TSV contact;
the added solder contacting the conductive material;
an electrical bump coupled to the subsequent die;
and a subsequent die bond pad that contacts the electrical bump.

16. The apparatus of claim 11, wherein the die is embedded in a coreless, bumpless build-up layer (BBUL-C) substrate, wherein the backside surface is exposed and the active surface is coupled to the BBUL-C substrate to achieve an embedded die.

17. An apparatus comprising:
a die including a through-silicon via (TSV) disposed therein, the die including an active surface and a backside surface;
a TSV contact that contacts the TSV;
an underfill material that contacts the backside surface with a contour characteristic of a removed die backside film (DBF) that was disposed on the backside surface;
conductive material with a contour that is characteristic of having been disposed in a recess of a removed die backside film (DBF), wherein the conductive material contacts the TSV contact; and
added solder that contacts the conductive material.

18. The apparatus of claim 17, wherein the die is an embedded die that is embedded in a coreless, bumpless build-up layer (BBUL-C) substrate, the apparatus further including a subsequent die coupled to the added solder.

19. The apparatus of claim 17, wherein the die is a first die, the apparatus further including a subsequent die coupled to the added solder, wherein the first die is a logic die with a first pin-out pitch, wherein the subsequent die is a logic die with a subsequent pin-out pitch, and wherein the first pin-out pitch matches the subsequent pin-out pitch.

20. The apparatus of claim 17, wherein the die is a first die, the apparatus further including a subsequent die coupled to the added solder, wherein the first die is a logic die with a first pin-out pitch, wherein the subsequent die is a memory die with a subsequent pin-out pitch, and wherein the first pin-out pitch is different from the subsequent pin-out pitch.

21. The apparatus of claim 17, wherein the die is an embedded die that is embedded in a coreless, bumpless build-up layer (BBUL-C) substrate, the apparatus further including:
a subsequent die coupled to the added solder, and wherein the embedded die and the subsequent die are coupled by:
the TSV contact;
the conductive material contacting the TSV contact;
the added solder contacting the conductive material;
an electrical bump coupled to the subsequent die;
and a subsequent die bond pad that contacts the electrical bump.

22. A computer system comprising:
a die including a through-silicon via (TSV) disposed therein, the die including an active surface and a backside surface;
a TSV contact that contacts the TSV;
an underfill material that contacts the backside surface with a contour characteristic of a removed die backside film (DBF) that was disposed on the backside surface;
conductive material with a contour that is characteristic of having been disposed in a recess of a removed die backside film (DBF), wherein the conductive material contacts the TSV contact;
added solder that contacts the conductive material, wherein the die is an embedded die that is embedded in a coreless, bumpless build-up layer (BBUL-C) substrate, the apparatus further including a subsequent die coupled to the added solder; and
a foundation substrate that supports the semiconductive substrate.

23. The computer system of claim 22, wherein the foundation substrate is part of a device selected from the group consisting of mobile device, a smartphone device, a tablet computer device, a vehicle, and a television.

* * * * *